United States Patent
Seo et al.

(10) Patent No.: US 7,262,479 B2
(45) Date of Patent: Aug. 28, 2007

(54) LAYOUT STRUCTURE OF FUSE BANK OF SEMICONDUCTOR MEMORY DEVICE

(75) Inventors: Eun-Sung Seo, Seoul (KR);
Hyun-Soon Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/620,015

(22) Filed: Jul. 14, 2003

(65) Prior Publication Data
US 2004/0042299 A1 Mar. 4, 2004

(30) Foreign Application Priority Data
Aug. 27, 2002 (KR) .................. 10-2002-0050836

(51) Int. Cl.
*H01L 29/00* (2006.01)
*H01L 27/10* (2006.01)

(52) U.S. Cl. .................. 257/529; 257/209; 257/530
(58) Field of Classification Search ........ 257/209, 257/529, 530; 438/132, 215, 281, 333, 467, 438/601; 365/225.7
See application file for complete search history.

(56) References Cited

U.S. PATENT DOCUMENTS

| | | | | |
|---|---|---|---|---|
| 5,208,782 A | * | 5/1993 | Sakuta et al. | 365/230.03 |
| 5,636,172 A | * | 6/1997 | Prall et al. | 365/225.7 |
| 5,679,967 A | * | 10/1997 | Janai et al. | 257/209 |
| 5,905,295 A | * | 5/1999 | Prall et al. | 257/529 |
| 5,986,321 A | * | 11/1999 | Froehner | 257/529 |
| 6,272,061 B1 | * | 8/2001 | Kato et al. | 365/225.7 |
| 6,355,968 B1 | * | 3/2002 | Lehmann et al. | 257/529 |
| 6,448,626 B1 | * | 9/2002 | Yoon | 257/529 |
| 6,486,526 B1 | * | 11/2002 | Narayan et al. | 257/529 |
| 6,601,194 B1 | * | 7/2003 | Dahn et al. | 714/42 |

FOREIGN PATENT DOCUMENTS

JP  2002-76122   3/2002
KR  2001-29286   4/2001

OTHER PUBLICATIONS

English language abstract of the Korean Publication No. 2001-29286.
English language abstract of the Japanese Publication No. 2002-76122.

* cited by examiner

*Primary Examiner*—Shouxiang Hu
(74) *Attorney, Agent, or Firm*—Marger Johnson & McCollom, P.C.

(57) ABSTRACT

A fuse bank of a semiconductor memory device is provided. The fuse bank includes first and second laser fuses. The first laser fuse includes a first laser fusing region disposed in a first direction, a first connecting line region bent in a second direction, and a second connecting line region bent in a third direction. The second laser fuse includes a second laser fusing region disposed in the first direction, a third connecting line region bent in the second direction, and a fourth connecting line region bent in the third direction. The first laser fuse and the second laser fuse have a space of a predetermined distance there between. The first and second laser fusing regions form a laser fusing region of the fuse bank, and the first and second laser fuse are disposed on a plane. The fuse bank is embodied on a single layer.

11 Claims, 5 Drawing Sheets

FIG. 5

| n | LATERAL SIZE OF CONVENTIONAL FUSE BANK (FIG. 2) | | LATERAL SIZE OF FUSE BANK ACCORDING TO FIRST EMBODIMENT | |
|---|---|---|---|---|
| | EQUATION | SIZE | EQUATION | SIZE |
| 2 | LF+PL+2WL | 5.6 μm | LF+PL+2WL | 5.6 μm |
| 4 | LF+4PL+2WL | 8.0 μm | LF+3PL+2WL | 7.2 μm |
| 6 | LF+7PL+2WL | 10.4 μm | LF+5PL+2WL | 8.8 μm |
| LF=4 μm, WL=0.4 μm, PL=2WS=0.8 μm | | | | |

LAYOUT STRUCTURE OF FUSE BANK OF SEMICONDUCTOR MEMORY DEVICE

BACKGROUND OF THE INVENTION

This application claims the priority of Korean Patent Application No. 2002-50836 filed on Aug. 27, 2002, in the Korean Intellectual Property Office, the disclosure of which is incorporated herein in its entirety by reference.

1. Field of the Invention

The present invention relates to a semiconductor memory device, and more particularly, to the structure of a fuse bank of a semiconductor memory device for reducing the pitch of the fuse bank.

2. Description of the Related Art

After all manufacturing steps of semiconductor memory devices have been completed; the semiconductor memory devices are tested for determining to whether the devices operate normally or not by various testing methods using various test parameters. If a defective control circuit of control circuits of a semiconductor memory device has been discovered during testing of the semiconductor memory device, the semiconductor memory device becomes unusable. However, if a defective memory cell or memory cells of a semiconductor memory device has been discovered during testing of the semiconductor memory device, the defective memory cell can be replaced with a redundant memory cell and the semiconductor memory device can operate normally. Fuses are widely used in the semiconductor memory devices having a scheme that replaces the defective memory cell with a redundant memory cell.

In a case where a defective memory cell exists, fuses connected to the defective memory cell are opened so that a redundant memory cell, in which the fuses are open, is driven by information. Thus, the defective memory cell can be replaced with the redundant memory cell. A fuse bank including multiple fuses is embedded in a chip of a semiconductor memory device so that the fuse bank becomes an element of the semiconductor memory device.

Currently, a trend exists of reducing the size of fuses as well as other elements in semiconductor memory devices. However, the extent of the size reduction of the fuses is less than that of the size reduction of other elements. Therefore, the size of the fuses may be contrary to the trend of smaller semiconductor memory devices.

FIG. 1 illustrates a first example of the layout structure of a conventional fuse bank 100. The fuse bank 100 of FIG. 1 includes multiple fuses 110, 120, 130, and 140. The multiple fuses 110, 120, 130, and 140 are arranged to extend in the same direction and are be parallel to each other.

In FIG. 1, in a case where the fuse bank 100 includes n fuses, the lateral size of the fuse bank 100 is n×PF. Here, n is an integral number, and PF represents the pitch between the fuses. The pitch PF is a parameter that is affected by fuse equipment rather than the minimum feature size with respect to respective lot generation. Reducing the minimum feature size does not reduce the pitch. Thus, the fuse size can affect layouts of other elements of a semiconductor memory device.

In order to solve the above problem, there is proposed a layout of a fuse bank having a structure different from that of the fuse bank of the FIG. 1. FIG. 2 illustrates a second example of the layout structure of a conventional fuse bank. The layout structure of the fuse bank shown in FIG. 2 is disclosed in U.S. Pat. No. 6,215,715, entitled "Integrated circuit memories including fuses between a decoder and a memory array for disabling defective storage cells in the memory array" and issued on Apr. 10, 2001, and incorporated by reference herein.

The fuse bank 200 shown in FIG. 2 includes multiple fuses 210, 220, 230, and 240. The multiple fuses 210, 220, 230, and 240 are grouped together in the longitudinal direction to form a single fuse bank 200.

In FIG. 2, in a case where the fuse bank 200 includes n fuses, the lateral size of the fuse bank 200 is given by the following Equation (1):

$$\text{Lateral Size} = (1.5n-2) \times PL + 2WL + LF \qquad (1)$$

In Equation (1), PL represents the pitch between connecting lines, WL represents the width of the connecting line, and LF represents the length of a laser fusing region.

As can be seen from Equation (1), the lateral size of the fuse bank has nothing to do with the pitch PF between the fuses. The lateral size of the fuse bank 200 can be reduced compared with that of the fuse bank 100 shown in the FIG. 1 by changing the layout of the fuse bank shown in FIG. 2.

However, the layout of the fuse bank 200 shown in FIG. 2 cannot be embodied on a single layer, because overlapped portions between the fuses exist, so two layers are required. Thus, a fuse bank layout that can be embodied on a single layer so as to reduce the size of the fuse bank is required.

SUMMARY OF THE INVENTION

The present invention provides a layout of a fuse bank that can be embodied on a single layer and reduce the size of the fuse bank.

According to a first aspect of the present invention, there is provided a fuse bank of a semiconductor memory device comprising a first laser fuse and a second laser fuse. The first laser fuse includes a first laser fusing region which is disposed in a first direction, a first connecting line region which is disposed to be bent in a second direction, and a second connecting line region which is disposed to be bent in a third direction. The second laser fuse includes a second laser fusing region which is disposed in the first direction, a third connecting line region which is disposed to be bent in the second direction, and a fourth connecting line region which is disposed to be bent in the third direction. The first laser fuse and the second laser fuse are disposed adjacently with a space of a predetermined distance there between, the first laser fusing region and the second laser fusing region form a laser fusing region of the fuse bank, and the first laser fuse and the second laser fuse are disposed on a plane.

Preferably, the laser fusing region has a parallelogram shape. Further, preferably, the first direction is perpendicular to the second direction and the third direction, and more preferably, the second direction is opposite to the third direction.

According to a second aspect of the present invention, there is provided a fuse bank of a semiconductor memory device. The fuse bank comprises a first laser fuse group which has multiple laser fuses arranged in a first direction with a space of a predetermined distance there between; and a second laser fuse group which has multiple laser fuses arranged in the first direction with a space of a predetermined distance there between. The first laser fuse group and the second laser fuse group each include a laser fusing region which is disposed in the first direction, a first connecting line region which is disposed to be bent in a second direction, and a second connecting line region which is disposed to be bent in a third direction. The first laser fuse and the second laser fuse are adjacently disposed on a plane.

Preferably, the laser fusing region has a parallelogram shape. Further preferably, the first direction is perpendicular to the second direction and the third direction, and more preferably, the second direction is opposite to the third direction.

Further preferably, the first laser fuse group and the second laser fuse group are disposed repeatedly.

According to a third aspect of the present invention, there is provided a fuse bank of a semiconductor memory device. The fuse bank comprises a first laser fuse group which has multiple laser fuses arranged in a first direction with a space of a predetermined distance there between; and a second laser fuse group which has multiple laser fuses arranged in the first direction with a space of a predetermined distance there between. The first laser fuse group and the second laser fuse group respectively includes a laser fusing region which is disposed in the first direction, a first connecting line region which is disposed to be bent in a second direction, and a second connecting line region which is disposed to be bent in a third direction. The first laser fuse group and the second laser fuse group are disposed adjacently, the first laser fuse group and the second laser fuse group are disposed to be symmetrical about the direction perpendicular to the first direction, and the first laser fuse group and the second laser fuse group are disposed on a plane.

Preferably, the laser fusing region has a parallelogram shape. Further, preferably, the first direction is perpendicular to the second direction and the third direction, and more preferably, the second direction is opposite to the third direction.

Further, preferably, the first laser fuse group and the second laser fuse group are disposed repeatedly.

BRIEF DESCRIPTION OF THE DRAWINGS

The above and other aspects and advantages of the present invention will become more apparent by describing in detail preferred embodiments thereof with reference to the attached drawings in which:

FIG. 5 is a table comparing the lateral size of the fuse bank having the layout structure of the conventional fuse bank with the lateral size of the fuse bank having the layout structure of the fuse bank according to the first embodiment of the present invention;

DETAILED DESCRIPTION OF THE INVENTION

Figure 3:
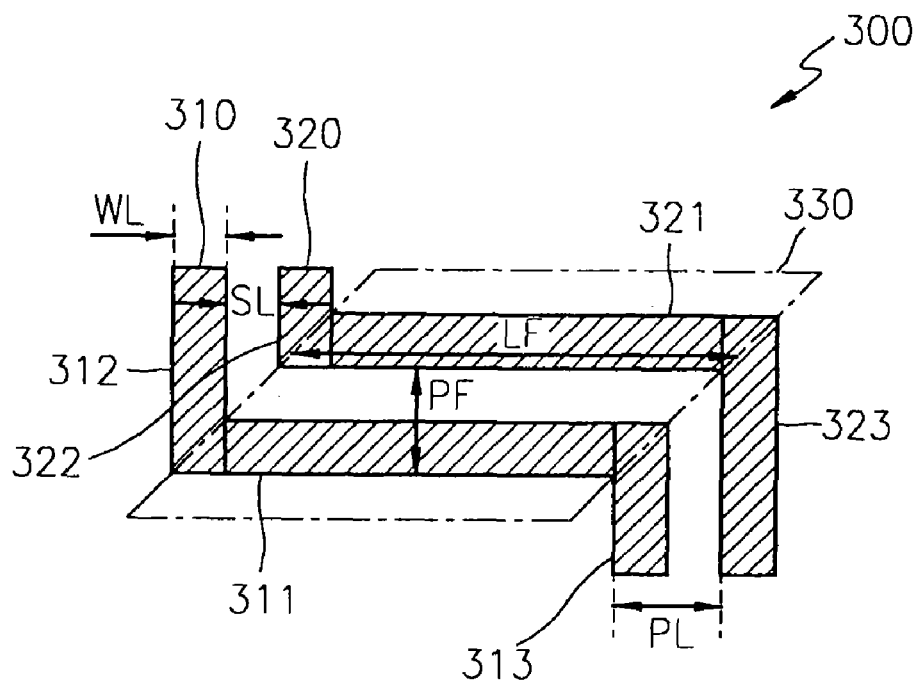
FIG. 3 illustrates a first embodiment of the layout structure of a fuse bank according to the present invention.

The present invention will now be described more fully with reference to the accompanying drawings, in which preferred embodiments of the invention are shown. The same reference numerals in different drawings represent the same elements. FIG. 3 illustrates a first embodiment of the layout structure of a fuse bank 300 according to the present invention. The fuse bank 300 shown in FIG. 3 includes a first laser fuse 310 and a second laser fuse 320.

The first laser fuse 310 includes a first laser fusing region 311, a first connecting line region 312, and a second connecting line region 313. The first laser fusing region 311 is disposed in a first direction, that is, a transverse direction. The first connecting line region 312 is disposed to be bent in a second direction, that is, a longitudinal direction. It is preferable that the second direction is perpendicular to the first direction. The second connecting line region 313 is disposed to be bent in a third direction that is also the longitudinal direction. It is preferable that the third direction is perpendicular to the first direction and is opposite to the second direction.

The second laser fuse 320 includes a second laser fusing region 321, a third connecting line region 322, and a fourth connecting line region 323. The second laser fusing region 321 is disposed in the first direction. The third connecting line region 322 is disposed to be bent in the second direction. As described above, it is preferable that the second direction is perpendicular to the first direction. The fourth connecting line region 323 is disposed to be bent in the third direction. As described above, it is preferable that the third direction is perpendicular to the first direction and is opposite to the second direction.

The first laser fuse 310 and the second laser fuse 320 are disposed adjacently with a space of a predetermined distance SL there between. The first laser fusing region 311 and the second laser fusing region 321 form a laser fusing region 330 of the fuse bank 300. Here, the laser fusing region 330 is referred to as a region fused by a laser according to a fusing program. The laser fusing region 330 receives a laser beam emitted according to a predetermined fusing program, to open a predetermined laser fuse.

The present embodiment is characterized in that the laser fusing region 330 has a parallelogram shape, and the first laser fuse 310 and the second laser fuse 320 are disposed on a plane so as to be embodied on a single layer. The layout of the fuse bank 300 according to the present invention has a parallelogram structure, and the lateral size of the fuse bank 300 is expressed as the following Equation 2:

$$\text{Lateral Size} = (n-1) \times PL + 2WL + LF \qquad (2)$$

In Equation (2), n represents the number of the fuses included in the fuse bank 300, PL represents the pitch between connecting lines, WL represents the width of the connecting line, and LF represents the length of the laser fusing region 330.

Figure 1:
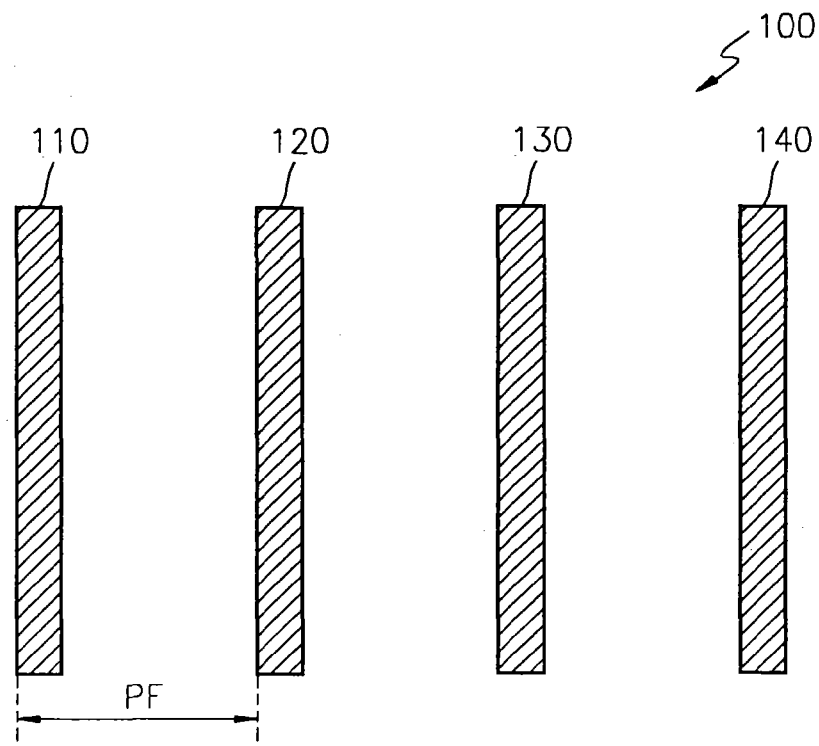
FIG. 1 illustrates a first example of the layout structure of a conventional fuse bank.
Figure 2:
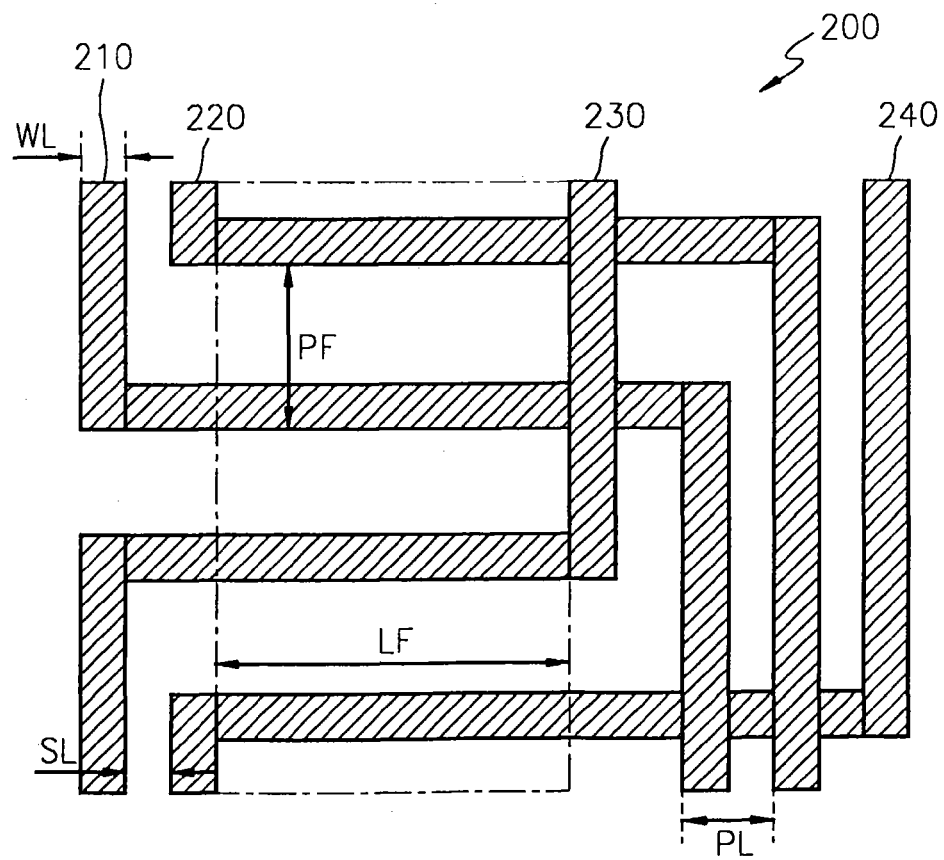
FIG. 2 illustrates a second example of the layout structure of a conventional fuse bank.

Since the laser fusing region 330 has a parallelogram structure, the lateral size of the fuse bank 300 is in direct proportion to the pitch PL between the connecting lines of the first and second laser fuses 310 and 320. Thus, it can be seen that the greater the number of fuses included in the fuse bank is the smaller the size of the fuse bank is, compared with the conventional fuse bank shown in FIG. 2.

Alternatively, each of the laser fusing regions could be described as having a first and second end. In terms of the spatial arrangement of FIG. 3, for example, the first end may be the left end of the fusing regions 311 and 321 and the second end may be the right end of the fusing regions 311 and 321. The connecting lines 312 and 320 connected to first ends of the fusing regions 311 and 321 are arranged in a first direction, and the connecting lines 313 and 323 connected to the second end of the fusing regions 311 and 321 are arranged in a second direction, where the first and second directions are parallel to the fusing regions.

Figure 4:
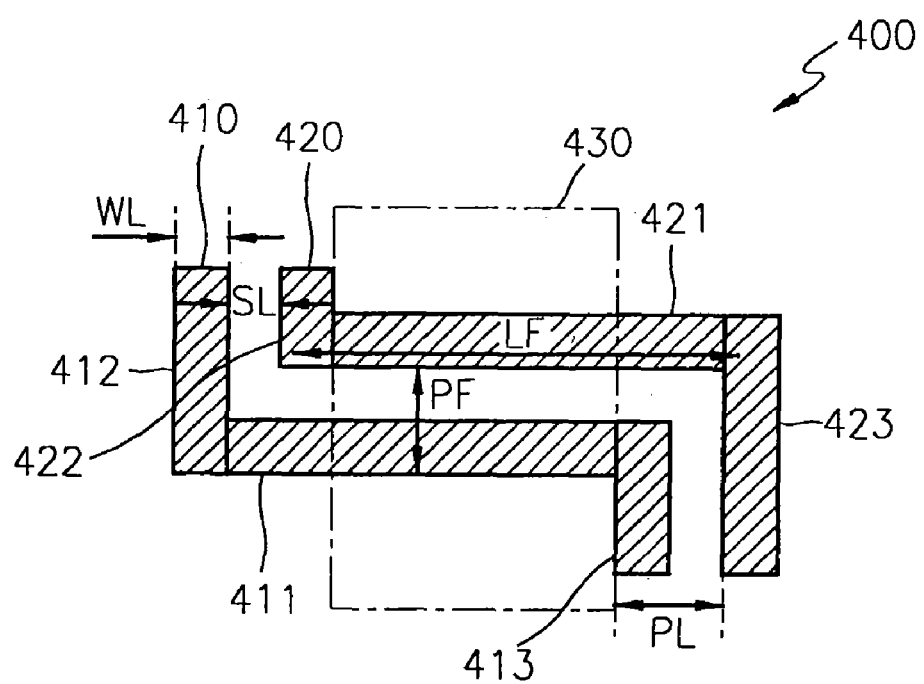
FIG. 4 illustrates a second embodiment of the layout structure of a fuse bank according to the present invention.

FIG. 4 illustrates a second embodiment of the layout structure of a fuse bank 400 according to the present invention. The fuse bank 400 shown in FIG. 4 includes a first laser fuse 410 and a second laser fuse 420.

The fuse bank 400 of FIG. 4 has the same structure as the fuse bank 300 of FIG. 3, except that a laser fusing region 430 has a rectangular shape. Since the laser fusing region 430 has a rectangular shape in the present embodiment, the fuse bank 400 according to the present embodiment can be embodied on a single layer.

Detailed descriptions of other structures of the fuse bank 400 shown in FIG. 4 in the second embodiment will be omitted because they are the same as those shown in FIG. 3. FIG. 5 is a table comparing the lateral size of the fuse bank having the layout structure of the conventional fuse bank with the lateral size of the fuse bank having the layout structure of the fuse bank 300 according to the first embodiment of the present invention. In FIG. 5, the lateral sizes of the conventional fuse bank and the fuse bank according to the present invention are compared, for cases where the number of the fuses included in the fuse bank is 2, 4, and 6.

Figure 6:
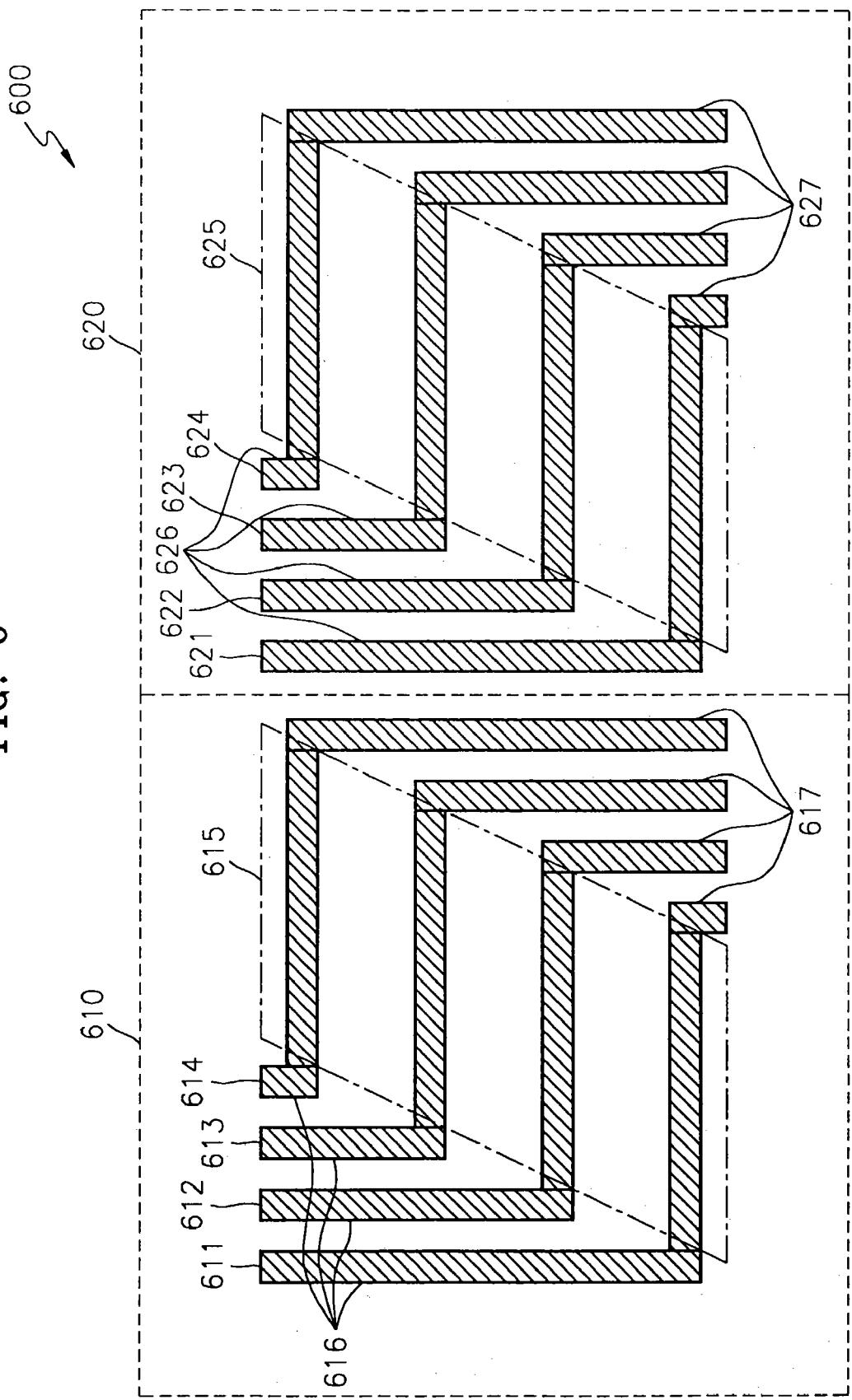
FIG. 6 illustrates a third embodiment of the layout structure of a fuse bank according to the present invention.

It can be seen from FIG. 5 that the lateral sizes of the fuse bank according to the present invention are smaller than that of the conventional fuse bank, and the fuse bank of the present invention is smaller by 15.4%, in the case where the number of the fuses is 6. FIG. 6 illustrates a third embodiment of the layout structure of a fuse bank 600 according to the present invention. The fuse bank 600 shown in FIG. 6 includes a first laser fuse group 610 and a second laser fuse group 620.

The first laser fuse group 610 includes multiple laser fuses 611, 612, 613, and 614. The multiple laser fuses 611, 612, 613, and 614 are disposed in a first direction, that is, a transverse direction, and each have a laser fusing region 615, a first connecting line region 616, and a second connecting line region 617.

The laser fusing region 615 of each of the laser fuses 611, 612, 613, and 614 is disposed in the first direction. The first connecting line region 616 of each of the laser fuses 611, 612, 613, and 614 is disposed to be bent in a second direction, that is, a longitudinal direction. The second connecting line region 617 of each of the laser fuses 611, 612, 613, and 614 is disposed to be bent in a third direction that is also the longitudinal direction. It is preferable that the first direction is perpendicular to the second direction and the third direction and that the second direction is opposite to the third direction.

The second laser fuse group 620 includes multiple laser fuses 621, 622, 623, and 624. Since the structure of the second laser fuse group 620 is the same as the first laser fuse group 610, a description thereof will be omitted.

The first laser fuse group 610 and the second laser fuse group 620 are adjacently disposed on a plane. The fuse bank 600 may be embodied by disposing repeatedly the first laser fuse group 610 and the second laser fuse group 620.

Figure 7:
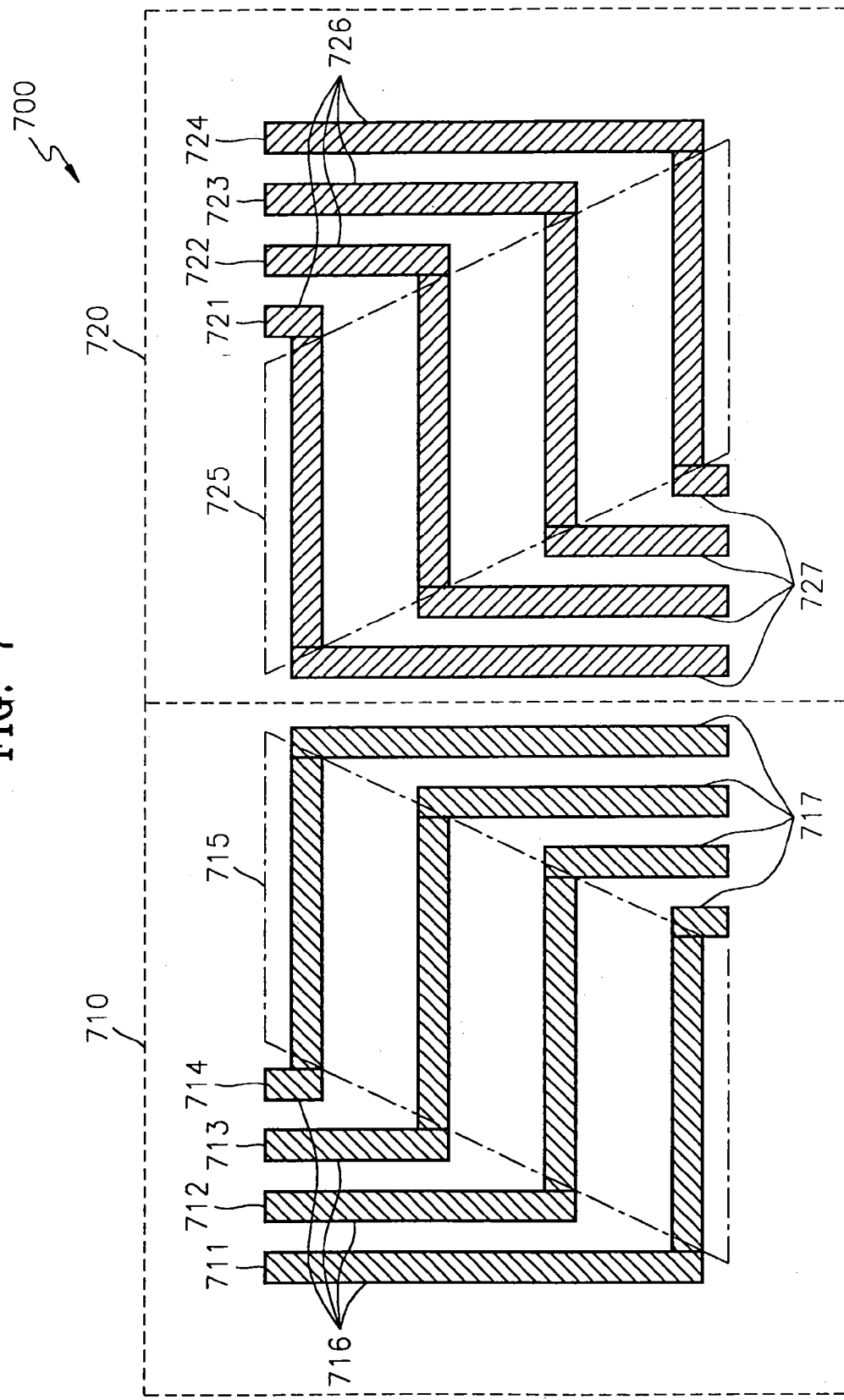
FIG. 7 illustrates a fourth embodiment of the layout structure of a fuse bank according to the present invention.

FIG. 7 illustrates a fourth embodiment of the layout structure of a fuse bank 700 according to the present invention. The fuse bank 700 shown in FIG. 7 includes a first laser fuse group 710 and a second laser fuse group 720.

The layout of the fuse bank 700 of FIG. 7 has the same structure as that of the fuse bank 600 of FIG. 6 except that a laser fusing region 715 of the first laser fuse group 710 and a laser fusing region 725 of the second laser fuse group 720 are disposed to be symmetrical about the direction perpendicular to the first direction.

In an alternative description, the fuse banks of FIG. 6 and FIG. 7 could be said to have at least two fuses each with a plurality of fusing regions, each fusing region with a first and a second end. The plurality of fuse regions are arranged parallel to each other and offset from each other a predetermined distance. A plurality of connecting lines are within each fuse, one disposed at the first and second ends of each of the plurality of fuse regions, wherein the plurality of connecting lines are perpendicular to the plurality of fuse regions.

In FIG. 6, the connecting lines connected to the first end of each of the fuse regions are disposed in a first direction and the connecting lines connected to the second end of each of the fuse regions are disposed in a second direction. In FIG. 7, the connecting lines connected to the first end of the fuse regions in the first fuse and the second end of the fusing regions in the second fuse are disposed in a first direction, and the connecting lines connected to the second end of the fuse regions in the first fuse and the first end of the second fuse are disposed in a second direction.

As described above, according to the present invention, a fuse bank can be embodied on a single layer, and the integration density of semiconductor memory devices can be increased by reducing the size of the fuse bank.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A fuse bank of a semiconductor memory device comprising:

a first laser fuse which includes a first laser fusing region which is stripe-shaped and disposed in a first direction, a first connecting line partially in the first laser fusing region, the first connection line is disposed to be bent in a second direction, and a second connecting line partially in the first laser fusing region, the second connecting line is disposed to be bent in a third direction; and a second laser fuse which includes a second laser fusing region which is stripe-shaped and disposed in the first direction, a third connecting line partially in the second laser fusing region, the third connection line is disposed to be bent in the second direction, and a fourth connecting line partially in the second laser fusing region, the fourth connection line is disposed to be bent in the third direction, wherein the first laser fuse and the second laser fuse are disposed adjacently in the fuse bank with a space of a predetermined distance there between, the first laser fusing region and the second laser fusing region form a laser fusing region of the fuse bank, and the first laser fuse and the second laser fuse are disposed on a plane, such that a lateral size of the fuse bank in the first direction is equal to:

(number of fuses in the fuse bank minus one) multiplied by a pitch between the connecting lines, plus twice the width of the connecting lines, plus a length of the laser fusing region, and wherein the second direction is perpendicular to the first direction and opposite the third direction.

2. The fuse bank of claim 1, wherein the laser fusing region has a parallelogram shape.

3. A fuse bank of a semiconductor memory device comprising:

a first laser fuse group having multiple laser fuses disposed on a plane arranged in a first direction with a space of a predetermined distance there between; and a second laser fuse group having multiple laser fuses disposed on the plane arranged in the first direction with a space of a predetermined distance there between, and wherein each laser fuse in each of the laser fuse groups includes a stripe-shaped laser fusing region disposed in the first direction, a first connecting line partially in the laser fusing region disposed to be bent in a second direction, and a second connecting line partially in the laser fusing region disposed to be bent in a third direction, and that a lateral size of the fuse bank in the first direction is equal to:

(number of fuses in the fuse bank minus one) multiplied by a pitch between the connecting lines, plus twice the width of the connecting lines, plus a length of the laser fusing region, and wherein the second direction is perpendicular to the first direction and opposite the third direction.

4. The fuse bank of claim 3, wherein the laser fusing region has a parallelogram shape.

5. The fuse bank of claim 3, wherein the first laser fuse group and the second laser fuse group are disposed repeatedly.

6. A fuse bank of a semiconductor memory device comprising:

a first laser fuse group having multiple laser fuses arranged in a first direction with a space of a predetermined distance there between; and a second laser fuse group having multiple laser fuses arranged in the first direction with a space of a predetermined distance there between, wherein each laser fuse in each of the laser fuse groups includes a stripe-shaped laser fusing region disposed in the first direction, a first connecting line partially in the laser fusing region disposed to be bent in a second direction, and a second connecting line partially in the first laser fusing region disposed to be bent in a third direction, the first laser fuse group and the second laser fuse group are disposed adjacently, the first laser fuse group and the second laser fuse group are disposed to be symmetrical about the direction perpendicular to the first direction, and the first laser fuse group and the second laser fuse group are disposed on a plane, such that a lateral size of the fuse bank in the first direction is equal to:

(number of fuses in the fuse bank minus one) multiplied by a pitch between the connecting lines, plus twice the width of the connecting lines, plus a length of the laser fusing region, and wherein the second direction is perpendicular to the first direction and opposite the third direction.

7. The fuse bank of claim 6, wherein the laser fusing region has a parallelogram shape.

8. The fuse bank of claim 6, wherein the first laser fuse group and the second laser fuse group are disposed repeatedly.

9. A fuse bank, comprising:

a fuse region formed from a first fuse region and a second fuse region, the first and second fuse regions arranged parallel to each other in a first direction in the bank, each with a first end and a second end; and connecting lines connected to each of the first and second fuse regions, such that each of the first and second fuse regions has a connecting line on each end, wherein the connecting lines on the first ends are perpendicular to the first and second fuse regions and parallel to each other in a second direction, and the connecting lines on the second ends are perpendicular to the first and second fuse regions and parallel to each other in a third direction, and that a lateral size of the fuse bank in the first direction is equal to:

(number of fuses in the fuse bank minus one) multiplied by a pitch between the connecting lines, plus twice the width of the connecting lines, plus a length of the laser fusing region, and wherein the second direction is perpendicular to the first direction and opposite the third direction.

10. The fuse bank of claim 9, the first and second fuse regions being offset from each other by a predetermined distance.

11. The fuse bank of claim 9, connecting lines at each end of the fuse region being offset from each other by a predetermined distance.

* * * * *

UNITED STATES PATENT AND TRADEMARK OFFICE
CERTIFICATE OF CORRECTION

PATENT NO. : 7,262,479 B2  Page 1 of 1
APPLICATION NO. : 10/620015
DATED : August 28, 2007
INVENTOR(S) : Eun-Sung Seo et al.

It is certified that error appears in the above-identified patent and that said Letters Patent is hereby corrected as shown below:

Column 7, line 40, the words "first laser" should read -- laser --.

Signed and Sealed this

Ninth Day of September, 2008

JON W. DUDAS
*Director of the United States Patent and Trademark Office*